(12) United States Patent
Chi et al.

(10) Patent No.: US 8,899,534 B2
(45) Date of Patent: Dec. 2, 2014

(54) ELECTRONIC DEVICE AND LINKAGE MECHANISM THEREOF

(71) Applicant: TPV-INVENTA Technology Co., Ltd., Taipei (TW)

(72) Inventors: Ming-Chin Chi, New Taipei (TW); Yen-Pang Liu, Taipei (TW)

(73) Assignee: TPV-INVENTA Technology Co., Ltd., Taipei (TW)

( * ) Notice: Subject to any disclaimer, the term of this patent is extended or adjusted under 35 U.S.C. 154(b) by 142 days.

(21) Appl. No.: 13/799,280

(22) Filed: Mar. 13, 2013

(65) Prior Publication Data

US 2014/0118899 A1 May 1, 2014

(30) Foreign Application Priority Data

Oct. 26, 2012 (TW) .............................. 101220831 U

(51) Int. Cl.
| | |
|---|---|
| *F16M 13/00* | (2006.01) |
| *F16C 11/04* | (2006.01) |
| *H05K 5/02* | (2006.01) |
| *F16M 11/04* | (2006.01) |
| *F16M 11/10* | (2006.01) |
| *F16M 11/20* | (2006.01) |
| *F16M 11/24* | (2006.01) |
| *F16M 13/02* | (2006.01) |
| *G06F 1/16* | (2006.01) |

(52) U.S. Cl.
CPC .............. *F16C 11/04* (2013.01); *H05K 5/0221* (2013.01); *F16M 11/041* (2013.01); *F16M 11/10* (2013.01); *F16M 11/2014* (2013.01); *F16M 11/2021* (2013.01); *F16M 11/24* (2013.01); *F16M 13/022* (2013.01); *G06F 1/1601* (2013.01); *F16M 2200/041* (2013.01); *F16M 2200/044* (2013.01); *Y10S 248/921* (2013.01)
USPC ..................... 248/124.2; 248/372.1; 248/921; 361/679.07

(58) Field of Classification Search
CPC . F16M 11/10; F16M 2200/044; F16M 11/04; F16M 11/2021; F16M 11/38; F16M 11/12; G06F 1/1601; Y10S 248/921
USPC ................ 248/124.1, 124.2, 372.1, 393, 397, 248/183.1, 184.1, 917, 919, 921, 922, 923; 361/679.06, 679.07, 679.22
See application file for complete search history.

(56) References Cited

U.S. PATENT DOCUMENTS

| | | | | |
|---|---|---|---|---|
| 6,330,993 | B1 * | 12/2001 | Cho .............................. | 248/371 |
| 7,273,202 | B2 * | 9/2007 | Tien et al. ..................... | 248/417 |
| 7,384,019 | B2 * | 6/2008 | Choi ............................. | 248/136 |

(Continued)

*Primary Examiner* — Bradley Duckworth
(74) *Attorney, Agent, or Firm* — Morris Manning & Martin LLP; Tim Tingkang Xia, Esq.

(57) ABSTRACT

An electronic device includes a linkage mechanism, a platform and a display module. The linkage mechanism includes a connecting structure, a bottom base and a top plate. The connecting structure includes a connecting plate, two pivoting members and a stopping member. The two pivoting members are respectively located at two opposite ends of the connecting plate. Each of the pivoting members includes a limiting piece. The stopping member is movably disposed on the connecting plate, and has two fastening portions respectively fastened to the limiting pieces. One of the pivoting members is pivotally disposed on the bottom base. The other pivoting member is pivotally disposed on the top plate. When the stopping member is moved and detached from the limiting pieces, the connecting structure is adapted to pivot relative to the bottom base and the top plate respectively.

27 Claims, 26 Drawing Sheets

(56) References Cited

U.S. PATENT DOCUMENTS

| | | | |
|---|---|---|---|
| 7,520,480 B2* | 4/2009 | Lee | 248/291.1 |
| 7,770,856 B2* | 8/2010 | Depay | 248/284.1 |
| 7,891,631 B2* | 2/2011 | Lee et al. | 248/371 |
| 7,967,260 B2* | 6/2011 | Hsu | 248/133 |
| 7,967,273 B2* | 6/2011 | Zhou et al. | 248/372.1 |
| 8,025,265 B2* | 9/2011 | Lee | 248/291.1 |
| 8,035,957 B2* | 10/2011 | Jung | 361/679.07 |
| 8,070,115 B2* | 12/2011 | Wang et al. | 248/157 |
| 8,191,838 B2* | 6/2012 | Carter | 248/188.6 |
| 8,256,725 B2* | 9/2012 | Wang et al. | 248/157 |
| 8,308,113 B2* | 11/2012 | Chen et al. | 248/122.1 |
| 2007/0029457 A1* | 2/2007 | Baek | 248/372.1 |
| 2007/0195495 A1* | 8/2007 | Kim et al. | 361/681 |
| 2007/0210221 A1* | 9/2007 | Kim et al. | 248/124.1 |
| 2008/0192417 A1* | 8/2008 | Hwang et al. | 361/681 |
| 2010/0102191 A1* | 4/2010 | Wang | 248/372.1 |

\* cited by examiner

ELECTRONIC DEVICE AND LINKAGE MECHANISM THEREOF

CROSS-REFERENCE TO RELATED APPLICATIONS

This non-provisional application claims priority under 35 U.S.C. §119(a) on Patent Application No(s). 101220831 filed in Taiwan, R.O.C. on Oct. 26, 2012, the entire contents of which are hereby incorporated by reference.

BACKGROUND OF THE INVENTION

1. Technical Field of the Invention

The disclosure relates to an electronic device and a linkage mechanism thereof, and more particularly to a detachable and pivotal electronic device and a linkage mechanism thereof.

2. Description of the Related Art

In recent years, with the development of technologies, electronic devices have been developing toward compact designs. Smart phones, tablet computers, notebook computers and desktop computers are all developing toward reduced volume and weight, so as to facilitate carrying by a user and reduce the space occupied. Meanwhile, with the evolution of technologies, the boundaries between smart phones, tablet computers, notebook computers and desktop computers have become increasingly blurred.

For example, a conventional desktop computer comprises a host, a display module and a set of input devices. Generally speaking, the host, the display module and the input devices are disposed separately, and are electrically connected to one another by a plurality of connecting wires. Specifically, the host is generally disposed in an accommodation space on the ground or disposed on a desk, and the display module and the input devices are disposed on a desk for use by a user. With such an arrangement, the host may occupy most of the space, which is not conducive to the effective use of the space. When the desktop computer needs to be removed or repaired, the huge host is not easily moved, leading to difficulty in removal or repair. In addition, when the host and the screen need to be assembled or disassembled, the connecting wire for connecting them needs to be connected or disconnected. Furthermore, when the desktop computer has a plurality of connecting wires, the connecting wires needs to be separated and disconnected, which also increase the difficulty in assembly and disassembly of the desktop computer.

Moreover, the display module generally comprises a fixing base and a screen. The fixing base is disposed on the desk, and the screen is generally connected to the fixing base in a pivotally connected manner or a completely fixed manner. However, generally a conventional screen can only pivot at a pivot angle relative to the fixing base, for example, a pivot axis that is parallel to the desktop, and the user pivots the screen vertically as required. Since only pivoting in one direction is allowed, the user cannot adjust the screen freely as required, resulting in operational inconvenience to the user.

SUMMARY OF THE INVENTION

A linkage mechanism, disclosed in an embodiment of the disclosure, comprises a connecting structure, a bottom base and a top plate. The connecting structure comprises a connecting plate, two pivoting members and a stopping member. The two pivoting members are respectively located at two opposite ends of the connecting plate. Each of the pivoting members comprises a shaft and a limiting piece. The limiting pieces are respectively disposed on the corresponding shafts and are adapted to rotate relative to the shafts. The stopping member is movably disposed on the connecting plate, and has two fastening portions. The fastening portions are respectively disposed on two sides of the stopping member and respectively fastened to the limiting pieces. One of the pivoting members is pivotally disposed on the bottom base. The other pivoting member is pivotally disposed on the top plate. When the stopping member is moved and detached from the limiting pieces, the connecting structure is adapted to pivot relative to the bottom base and the top plate respectively.

An electronic device, disclosed in another embodiment of the disclosure, comprises a platform, a linkage mechanism and a display module. The platform comprises a substrate and a fastening structure. The substrate has a first surface, a second surface and a fastening slot, the fastening slot being formed through the first surface and the second surface that are opposite to each other. The fastening structure is pivotally disposed on the second surface and comprises a hook, the hook being located at the fastening slot. The linkage mechanism comprises a top plate and a bottom base. The top plate has a through slot, the bottom base comprises a fixing column, and the hook is detachably fastened to the fixing column. The display module comprises a main body, a fastening member and a fixing plate. The fastening member is disposed on the main body. The fixing plate has at least one assembly hole formed through the fixing plate. The fastening member has at least one fastening plate running through the assembly hole of the fixing plate and the through slot, and the fastening plate is detachably fastened to the top plate.

An electronic device, disclosed in still another embodiment of the disclosure, comprises a linkage mechanism, a platform and a display module. The linkage mechanism comprises a connecting structure, a bottom base and a top plate. The connecting structure comprises a connecting plate, two pivoting members and a stopping member. The two pivoting members are respectively located at two opposite ends of the connecting plate. Each of the pivoting members comprises a shaft and a limiting piece. The limiting pieces are respectively disposed on the shafts and adapted to rotate relative to the shafts. The stopping member is movably disposed on the connecting plate, and has two fastening portions. The fastening portions are respectively disposed on two sides of the stopping member and respectively fastened to the limiting pieces. The bottom base comprises a fixing column, one of the pivoting members is pivotally disposed on the bottom base, and the other pivoting member is pivotally disposed on the top plate. The top plate has a through slot, and when the stopping member is moved and detached from the limiting pieces, the connecting structure pivots relative to the bottom base and the top plate respectively. The bottom base is detachably disposed on the platform. The platform comprises a substrate and a fastening structure. The substrate has a first surface, a second surface and a fastening slot. The fastening slot is formed through the first surface and the second surface that are opposite to each other. The fastening structure is pivotally disposed on the second surface and comprises a hook which is detachably fastened to the fixing column. The display module comprises a main body, a fastening member and a fixing plate. The fastening member is disposed on the main body, the fixing plate has at least one assembly hole formed through the fixing plate, and the fastening member has at least one fastening plate running through the assembly hole of the fixing plate and the through slot, and the fastening plate is detachably fastened to the top plate.

BRIEF DESCRIPTION OF THE DRAWINGS

The disclosure will become more fully understood from the detailed description given herein below for illustration only, and thus does not limit the disclosure, and wherein.

DETAILED DESCRIPTION

Figure 1:
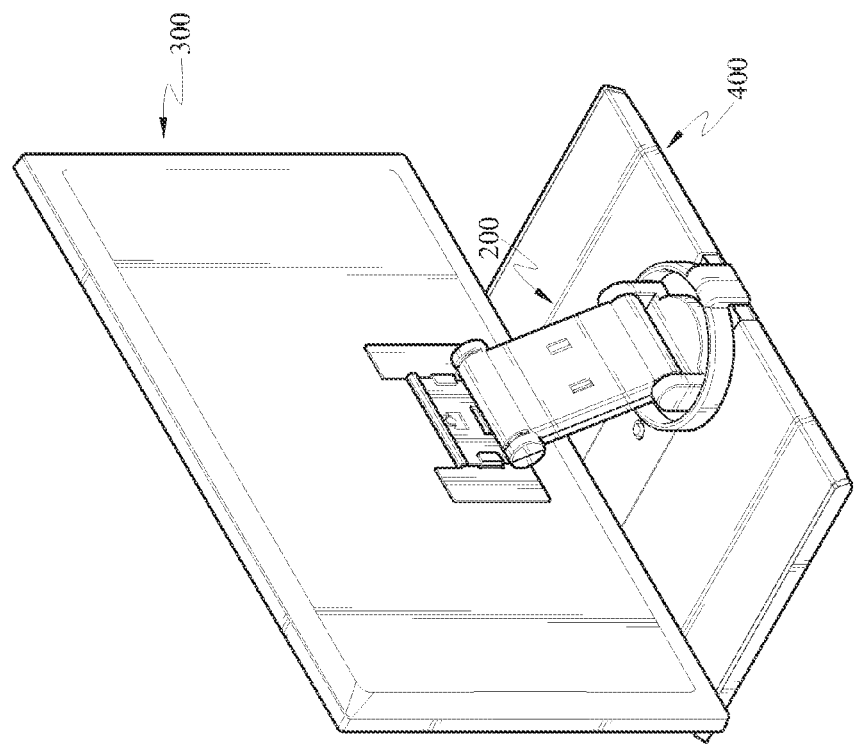
FIG. 1 is a schematic three-dimensional view of an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides an electronic device, which is capable of multidirectional pivoting and allows fast assembly and disassembly. In this embodiment, the electronic device is a personal computer, which may be placed on a desk or hand-held by a user for use, but the disclosure is not limited thereto.

Figure 2:
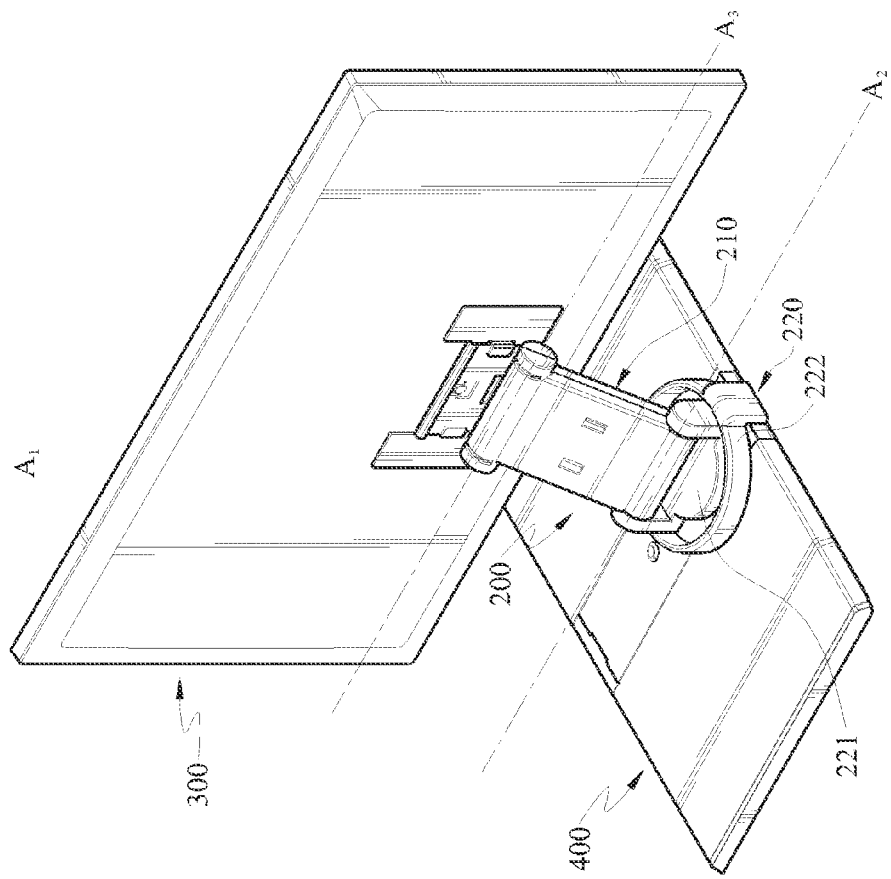
FIG. 2 is a schematic three-dimensional view of the pivoting of an electronic device according to an embodiment of the disclosure.
Figure 3:
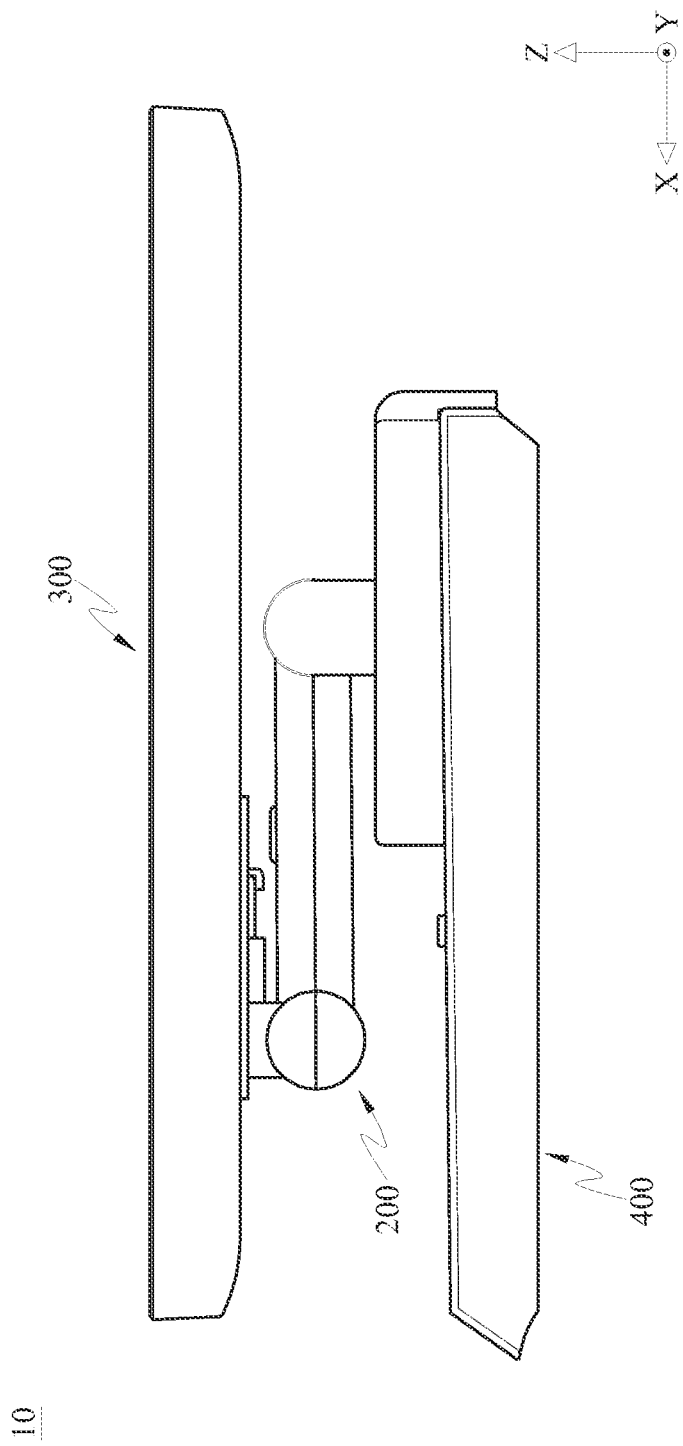
FIG. 3 is a schematic side view of an electronic device according to an embodiment of the disclosure.

The structure and operation of the electronic device will be described in detail below. Referring to FIG. 1 to FIG. 3, FIG. 1 is a schematic three-dimensional view of an electronic device according to an embodiment of the disclosure, FIG. 2 is a schematic three-dimensional view of the pivoting of an electronic device according to an embodiment of the disclosure, and FIG. 3 is a schematic side view of an electronic device according to an embodiment of the disclosure.

An electronic device 10 of this embodiment comprises a linkage mechanism 200, a display module 300 and a platform 400. The linkage mechanism 200 is detachably disposed on the platform 400, and the display module 300 is also detachably disposed on the linkage mechanism 200. In addition, as shown in FIG. 2, the display module 300 is capable of pivoting around a first axis A1 of the linkage mechanism 200 relative to the platform 400. As shown in FIG. 3, the display module 300 is capable of pivoting around a second axis A2 as well as a third axis A3 of the linkage mechanism 200. In this embodiment, the first axis A1 runs through the platform 400, the second axis A2 and the third axis A3 are parallel to each other, and the first axis A1 is perpendicular to the second axis A2 as well as the third axis A3. In other words, the axis (the first axis A1) which the display module 300 pivots relative to the platform 400 is orthogonal to the axes (the second axis A2 and the third axis A3) which the linkage mechanism 200 pivots relative to the platform 400 as well as relative to the display module 300, but the above axis directions are not intended to limit the disclosure. Furthermore, as shown in FIG. 2, the linkage mechanism 200 comprises a bottom base 220. The bottom base 220 comprises a rotatable component 221 and a fixing component 222. The rotatable component 221 is pivotally disposed on the fixing component 222. When the fixing component 222 is disposed on the platform 400, the display module 300 and the linkage mechanism 200 are capable of pivoting around the first axis A1 relative to the platform 400 by means of the rotatable component 221. In this embodiment, the first axis A1 is located in the center of the fixing component 222 and perpendicular to the platform 400, but the disclosure is not limited thereto.

Figure 4:
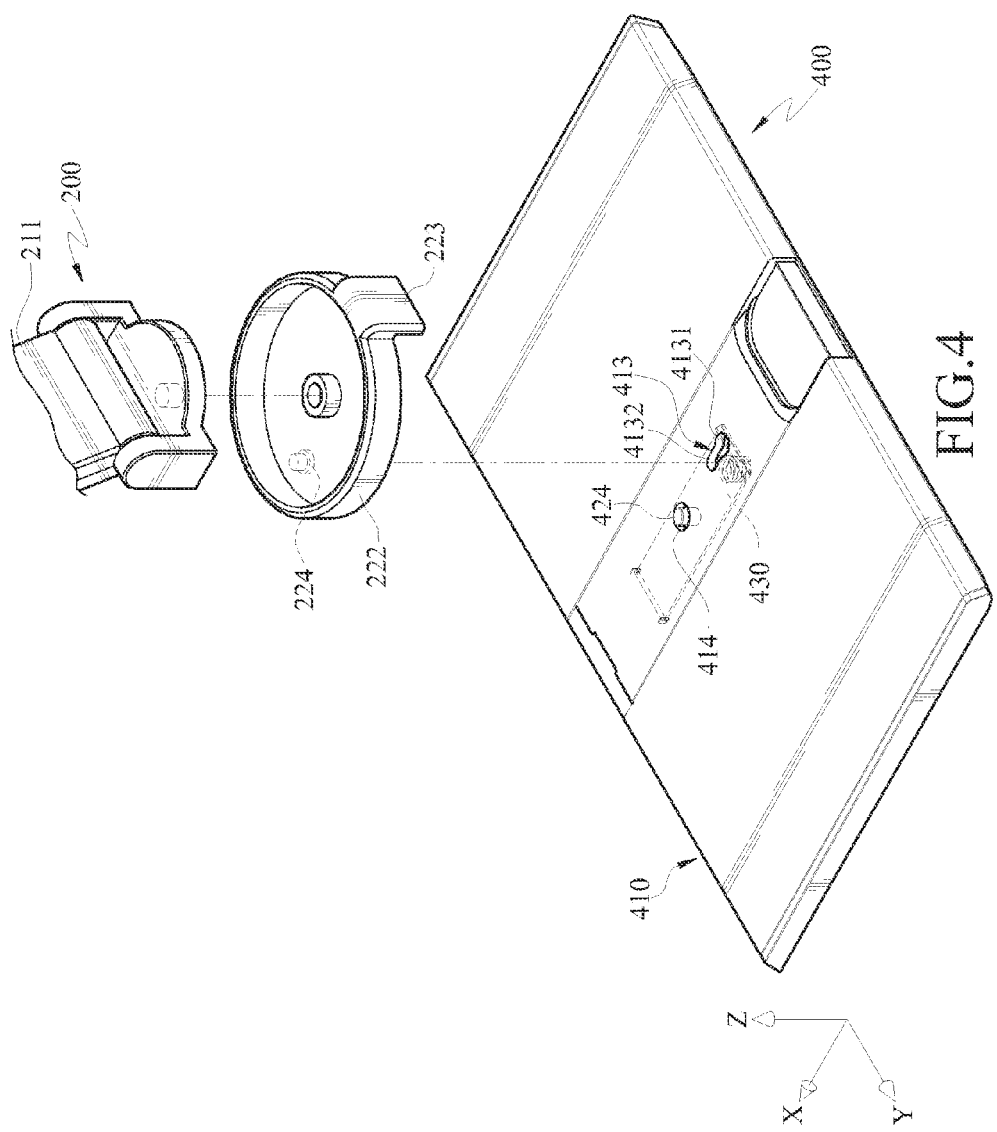
FIG. 4 is a partial exploded perspective view of a platform and a linkage mechanism according to an embodiment of the disclosure.
Figure 5A:
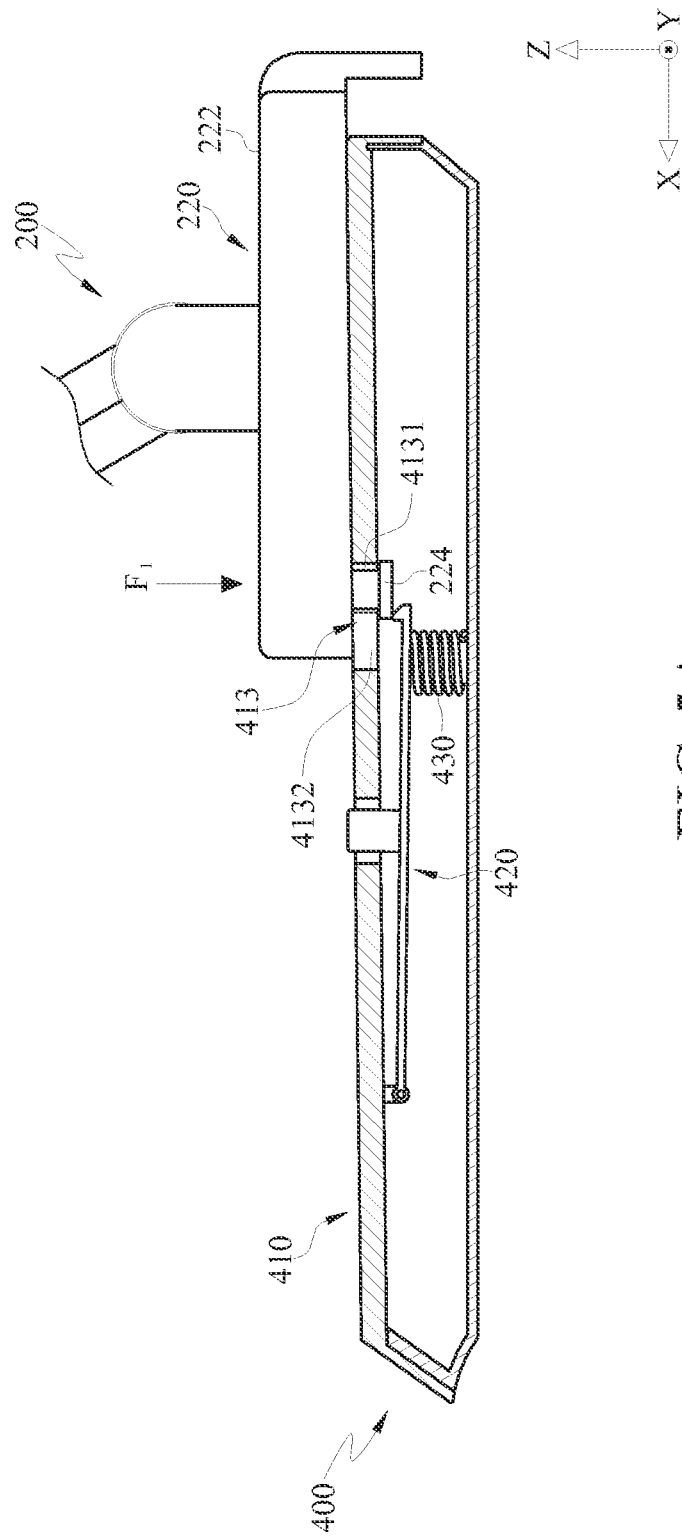
FIG. 5A is a first view illustrating the operation of a platform and a linkage mechanism according to an embodiment of the disclosure.
Figure 5B:
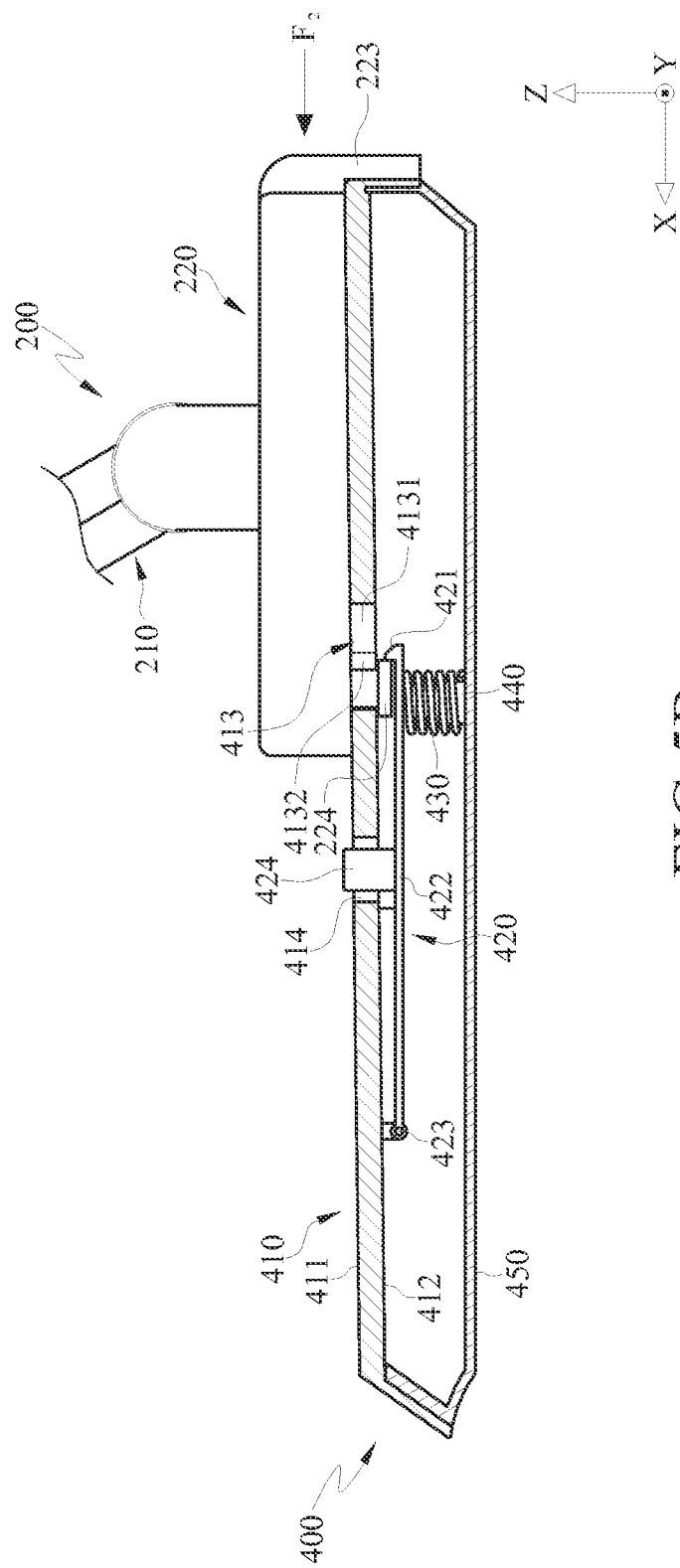
FIG. 5B is a second view illustrating the operation of a platform and a linkage mechanism according to an embodiment of the disclosure.

The structure of the platform 400 and a method for assembling and disassembling the platform 400 and the display module 300 will be described below. Referring to FIG. 1, FIG. 4 and FIG. 5B, FIG. 4 is a partial exploded perspective view of a platform and a linkage mechanism according to an embodiment of the disclosure, and FIG. 5B is a second view illustrating the operation of a platform and a linkage mechanism according to an embodiment of the disclosure. The platform 400 comprises a substrate 410, a bottom plate 450, a fastening structure 420 and a plurality of electronic elements (not shown). An accommodation space is formed between the substrate 410 and the bottom plate 450, and the electronic elements are disposed in the accommodation space. The substrate 410 has a first surface 411, a second surface 412 and a fastening slot 413. The first surface 411 and the second surface 412 are opposite to each other. The fastening slot 413 is formed through the first surface 411 and the second surface 412. In this embodiment and some other embodiments, the substrate 410 further has a through hole 414 which is formed through the first surface 411 and the second surface 412, and the through hole 414 is adjacent to the fastening slot 413.

The fastening structure 420 comprises a hook 421, a cantilever 422, a pivot base 423 and a first pressing portion 424. The hook 421 and the pivot base 423 are respectively disposed at two ends of the cantilever 422. The pivot base 423 of the fastening structure 420 is pivotally disposed on the second surface 412 of the substrate 410, so that the fastening structure 420 may pivot around a Y-axis relative to the substrate 410, but the above pivoting direction is not intended to limit the disclosure. The hook 421 is located at the fastening slot 413. The first pressing portion 424 runs through the through hole 414 from the second surface 412 toward the first surface 411, so that the first pressing portion 424 protrudes out of the substrate 410. In this embodiment and some other embodiments, the platform 400 further comprises a positioning member 440 and a first elastic member 430. The positioning member 440 is disposed on the bottom plate 450. The first elastic member 430 is disposed in the platform 400 and sleeved on the positioning member 440, it faces the fastening slot 413 of the second surface 412, and is pressed against the fastening structure 420. Moreover, in this embodiment and some other embodiments, the bottom base 220 of the linkage mechanism 200 comprises a fixing column 224, and the hook 421 is detachably fastened to the fixing column 224. Furthermore, the fastening slot 413 has an inserting segment 4131 and a fastening segment 4132. In this embodiment, the inner diameter of the inserting segment 4131 is greater than the outer diameter of the fixing column 224, and the inner diameter of the fastening segment 4132 is roughly equal to or smaller than the outer diameter of the fixing column 224, but the disclosure is not limited thereto.

A method for assembling and disassembling the linkage mechanism 200 and the platform 400 will be described below. Referring to FIG. 4 and FIG. 5A, FIG. 5A is a first view illustrating the operation of a platform and a linkage mechanism according to an embodiment of the disclosure. First, in this embodiment, a first external force F1 is applied along a negative Z-axis direction to push the fixing column 224 of the linkage mechanism 200 to run through the inserting segment 4131 of the fastening slot 413, so that a part of the fixing column 224 enters the accommodation space of the linkage mechanism 200.

Referring to FIG. 5B, FIG. 5B is a second view illustrating the operation of a platform and a linkage mechanism according to an embodiment of the disclosure. Then, in this embodiment, a second external force F2 is applied to push the linkage mechanism 200 to move toward a positive X-axis direction. At this time, the fixing column 224 enters the fastening segment 4132 from the inserting segment 4131 of the fastening slot 413, and at the same time, the first elastic member 430 pushes against the hook 421 of the fastening structure 420, so that the fixing column 224 is fastened to the hook 421. Moreover, in this embodiment and some other embodiments, the bottom base 220 further comprises a stopping portion 223, and the stopping portion 223 is pressed against a side edge of the platform 400. That is, the fixing column 224 is located between the stopping portion 223 and the fastening structure 420. The stopping portion 223 is used for stably disposing the linkage mechanism 200 onto the platform 400.

Figure 5C:
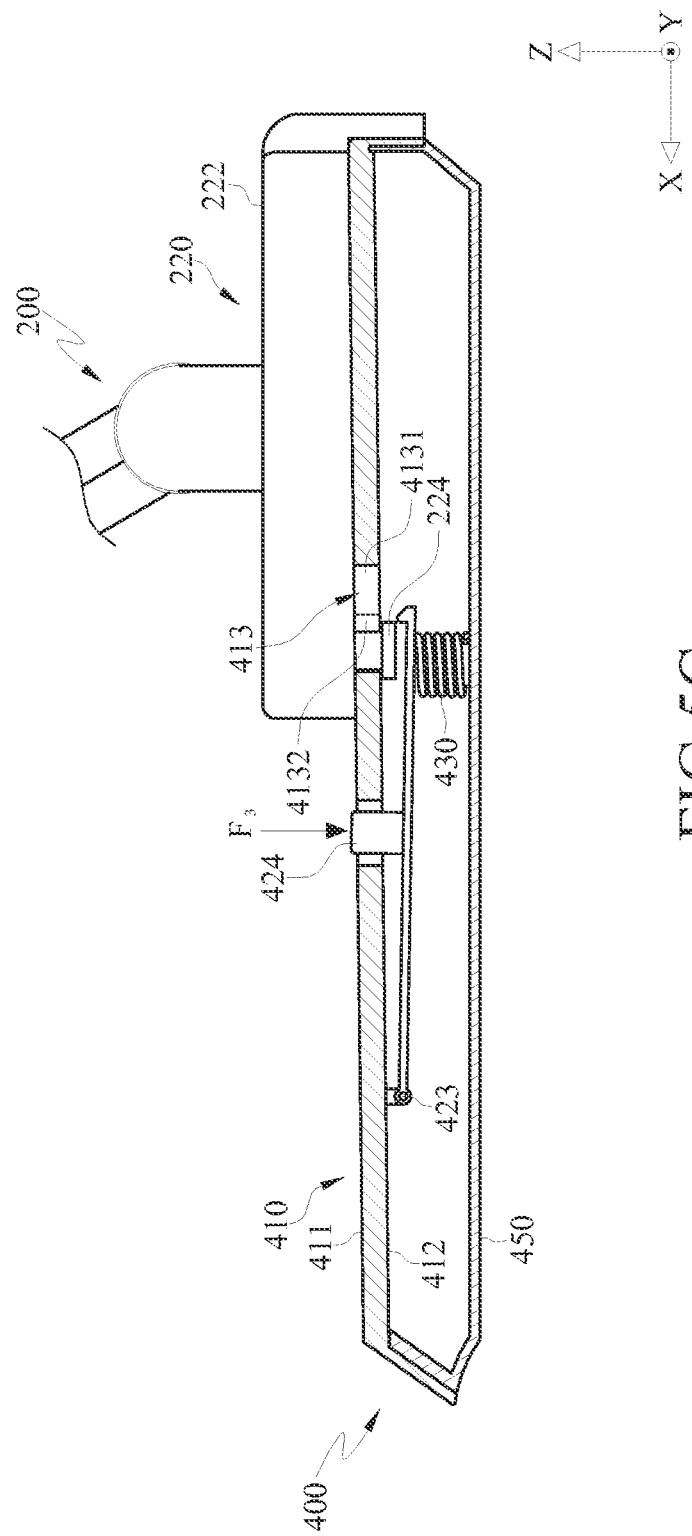
FIG. 5C is a third view illustrating the operation of a platform and a linkage mechanism according to an embodiment of the disclosure.

Referring to FIG. 5C, FIG. 5C is a third view illustrating the operation of a platform and a linkage mechanism according to an embodiment of the disclosure. When it is intended to remove the linkage mechanism 200, a third external force F3 is applied to the first pressing portion 424 along the negative Z-axis direction, the fastening structure 420 pivots around the pivot base 423 toward the first elastic member 430, so that the hook 421 is detached from the fixing column 224. Thus, the fixing column 224 can be driven by another external force to move from the fastening segment 4132 into the inserting segment 4131, so that the linkage mechanism 200 can be detached from the platform 400 freely.

Figure 6A:
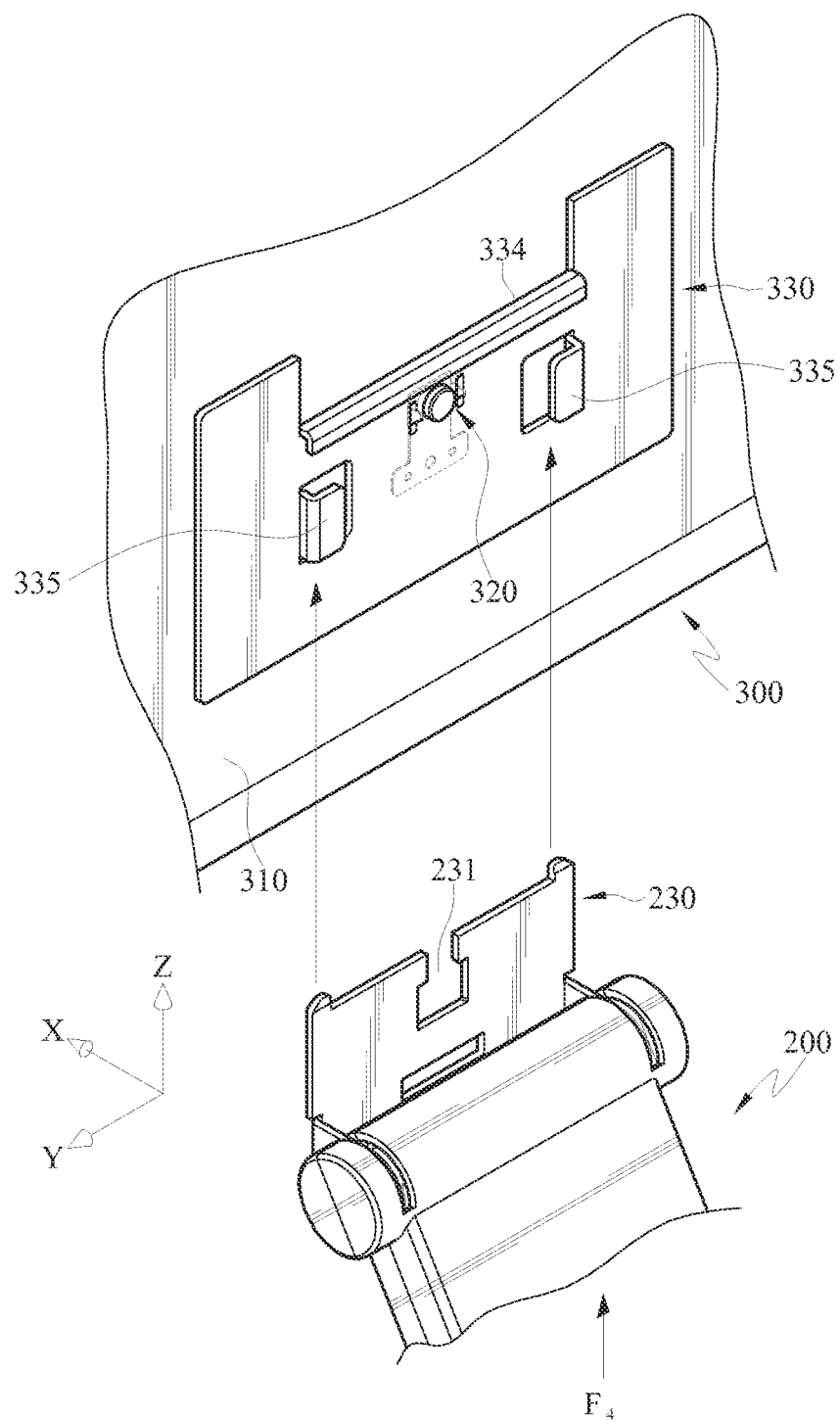
FIG. 6A is a first view illustrating the operation of a display module and a linkage mechanism according to an embodiment of the disclosure.
Figure 6B:
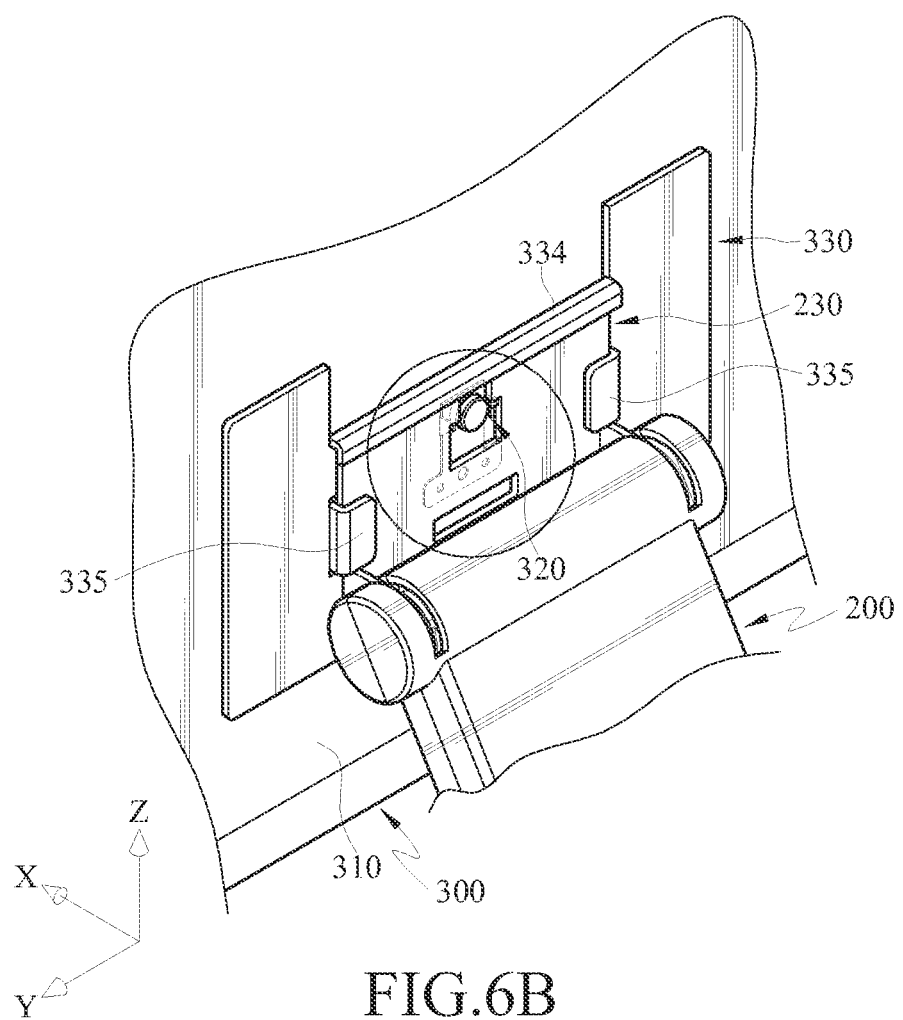
FIG. 6B is a second view illustrating the operation of a display module and a linkage mechanism according to an embodiment of the disclosure.
Figure 6C:
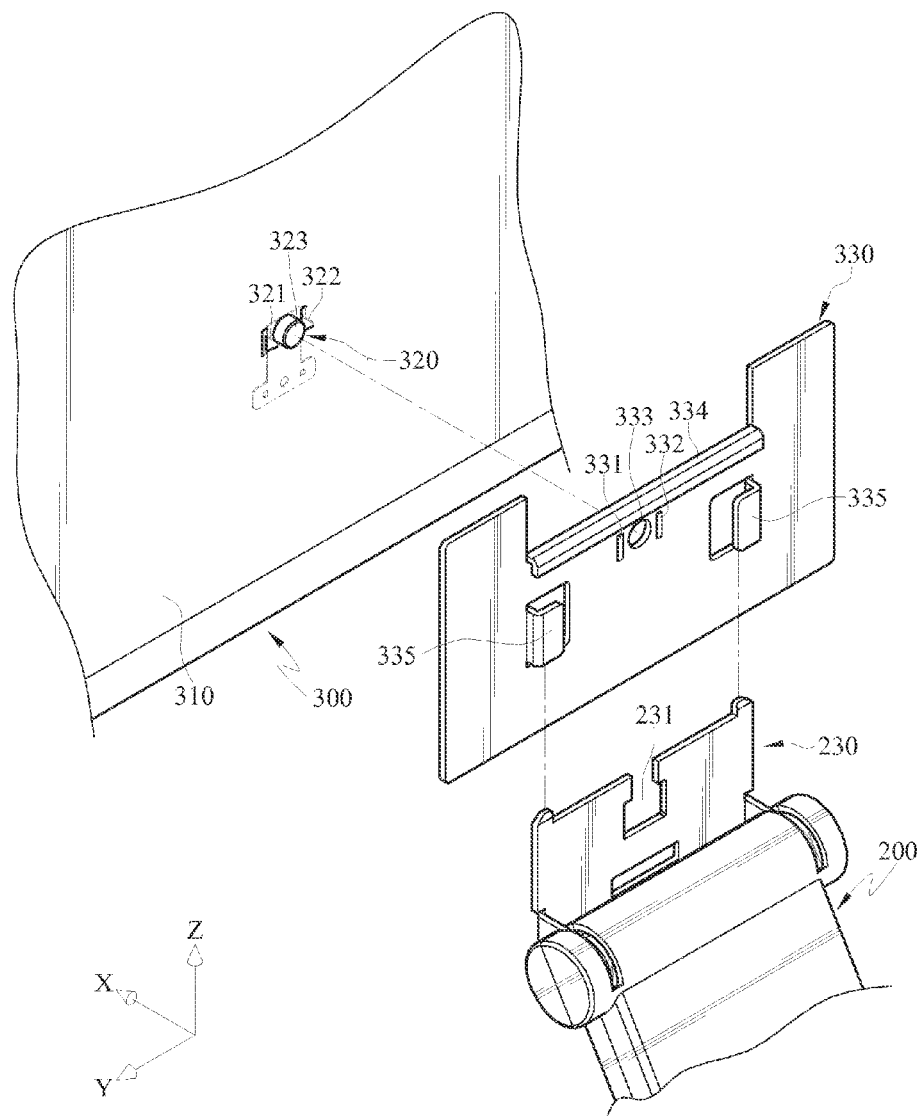
FIG. 6C is a schematic exploded view of a display module and a linkage mechanism according to an embodiment of the disclosure.

The structure of the display module 300 and a method for assembling and disassembling the display module 300 and the linkage mechanism 200 will be described below. Referring to FIG. 6B, FIG. 6C and FIG. 6E, FIG. 6B is a second view illustrating the operation of a display module and a linkage mechanism according to an embodiment of the disclosure, FIG. 6C is a schematic exploded view of a display module and a linkage mechanism according to an embodiment of the disclosure, and FIG. 6E is a partial enlarged perspective view of FIG. 6B. In this embodiment, the linkage mechanism 200 comprises a top plate 230. The top plate 230 has a through slot 231. The display module 300 comprises a main body 310, a fastening member 320 and a fixing plate 330. The fastening member 320 is disposed on the main body 310. In this embodiment, one end of the fastening member 320 is fixed to the main body 310, but the disclosure is not limited thereto. The main body 310 of the display module 300 comprises a plurality of electronic elements and a display screen (not shown) which is used for displaying information to the user. The fixing plate 330 has two assembly holes 331 and 332 and a disassembly hole 333, and the assembly holes 331 and 332 and the disassembly hole 333 are all formed through the fixing plate 330. The fastening member 320 has two fastening plates 321 and 322 and a second pressing portion 323, the fastening plates 321 and 322 run through the assembly holes 331 and 332 of the fixing plate 330 respectively, and both the fastening plates 321 and 322 run through the through slot 231, so that the fastening plates 321 and 322 are detachably fastened to the top plate 230 of the linkage mechanism 200. Specifically, the fastening plates 321 and 322 are triangular plates, which may be pressed against a side edge of the through slot 231 of the top plate 230 of the linkage mechanism 200, so that the linkage mechanism 200 and the display module 300 are fixed to each other. In this embodiment and some other embodiments, the second pressing portion 323 runs through the disassembly hole 333, so that the second pressing portion 323 is exposed to the fixing plate 330 and the top plate 230. Moreover, the fixing plate 330 comprises a top engaging slot 334 and two side engaging slots 335, and when the fastening plates 321 and 322 are fixed to the top plate 230, the top engaging slot 334 and the two side engaging slots 335 are used for disposing the top plate 230 onto the fixing plate 330 more stably.

The method for assembling and disassembling the display module 300 and the linkage mechanism 200 will be described below. Referring to FIG. 6A, which is a first view illustrating the operation of a display module and a linkage mechanism according to an embodiment of the disclosure. First, the top plate 230 of the linkage mechanism 200 is driven by a fourth external force F4 to move along a positive Z-axis towards the fixing plate 330 of the display module 300.

Referring to FIG. 6B and FIG. 6C, at this time, the through slot 231 of the top plate 230 is fastened to the fastening plates 321 and 322 of the fastening member 320, and three adjacent side edges of the top plate 230 are respectively held to the two side engaging slots 335 and the top engaging slot 334. Thus, the assembly of the display module 300 and the linkage mechanism 200 is completed.

Figure 6D:
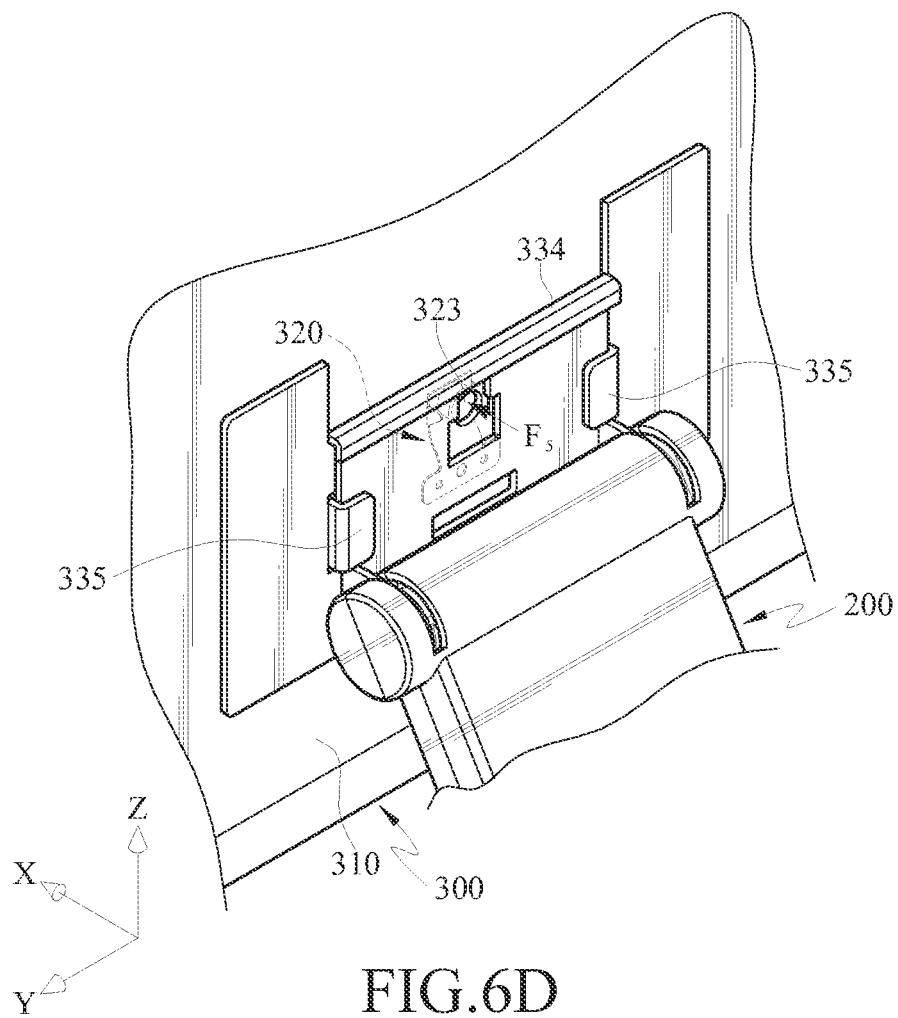
FIG. 6D is a third view illustrating the operation of a display module and a linkage mechanism according to an embodiment of the disclosure.
Figure 6E:
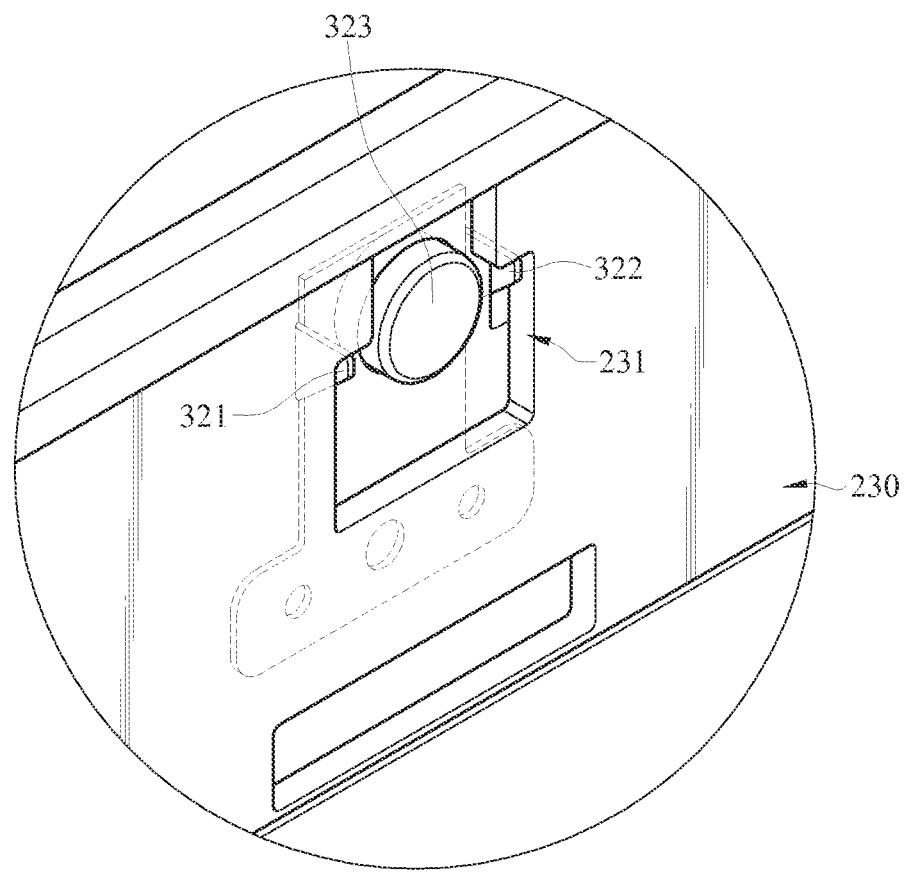
FIG. 6E is a partial enlarged perspective view of FIG. 6B.

Referring to FIG. 6D, which is a third view illustrating the operation of a display module and a linkage mechanism according to an embodiment of the disclosure. When it is intended to separate the display module 300 and the linkage mechanism 200, a fifth external force F5 is applied to the second pressing portion 323 of the fastening member 320, to drive the fastening member 320 to move toward the main body 310 (positive X-axis), so that the top plate 230 of the linkage mechanism 200 is detached from the fastening member 320. That is, the top plate 230 can be detached from the two side engaging slots 335 toward the negative Z-axis direction. Thus, the disassembly of the display module 300 and the linkage mechanism 200 is completed.

Figure 7A:
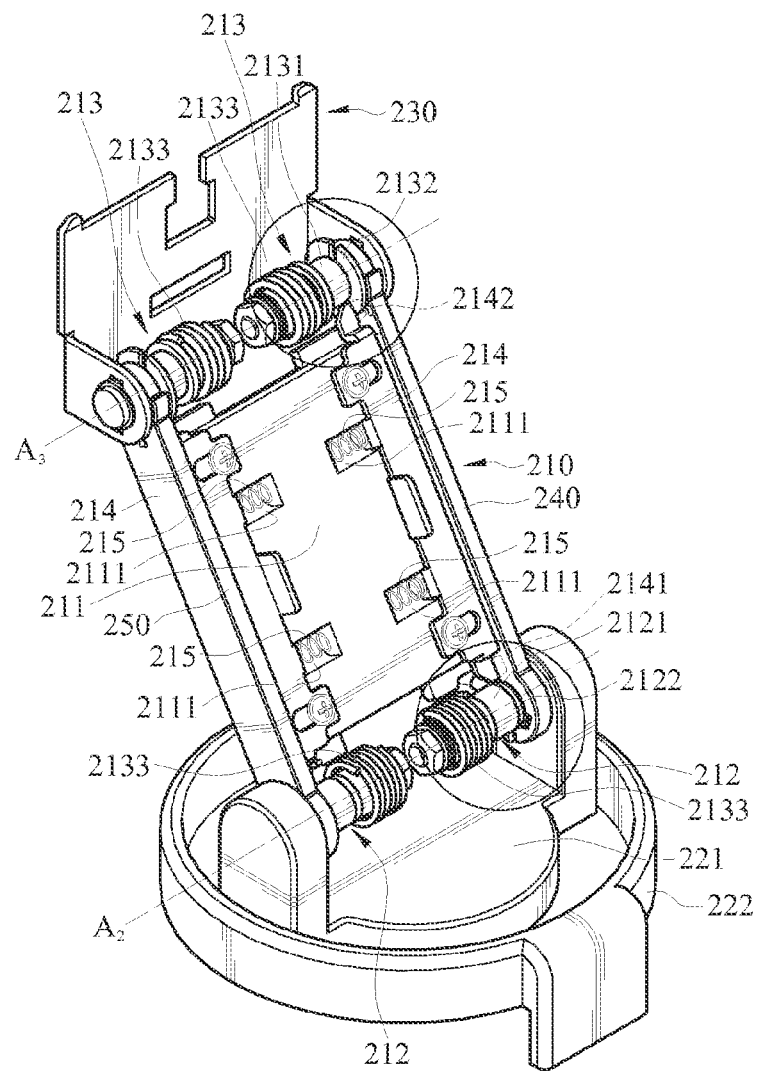
FIG. 7A is a first view illustrating the operation of a linkage mechanism according to an embodiment of the disclosure.
Figure 7E:
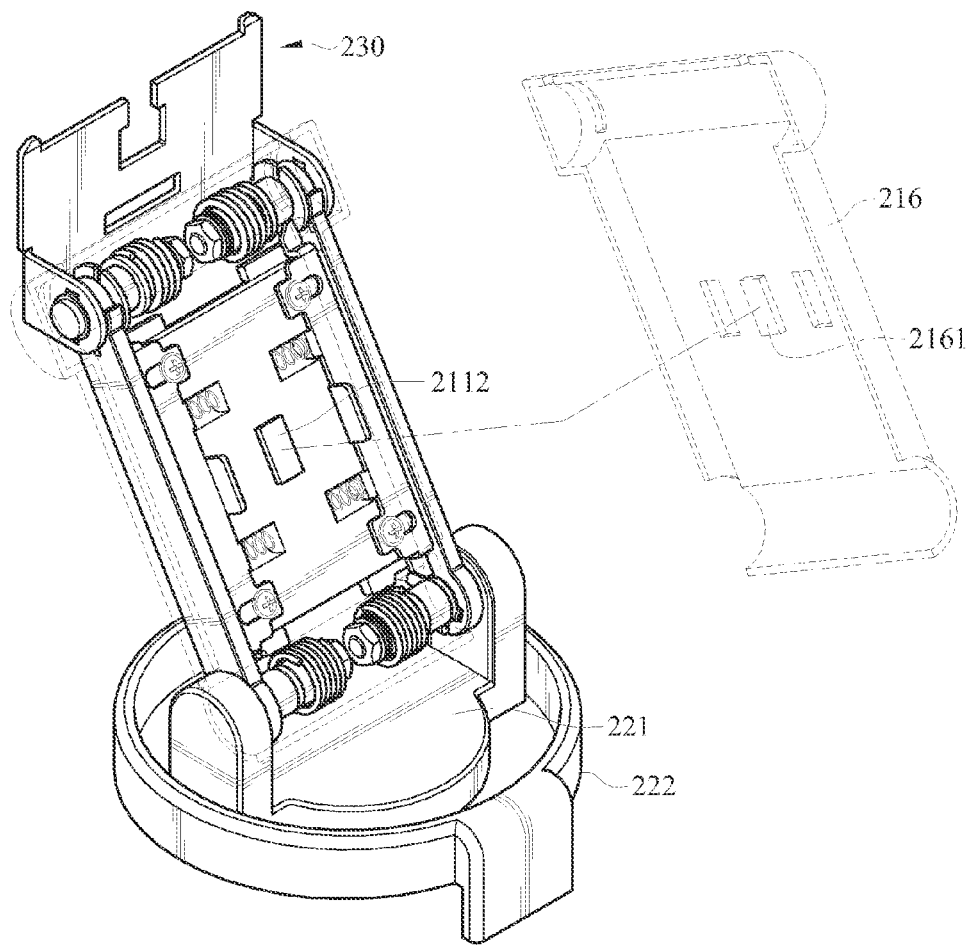
FIG. 7E is a schematic three-dimensional exploded view of a linkage mechanism according to an embodiment of the disclosure.
Figure 8A:
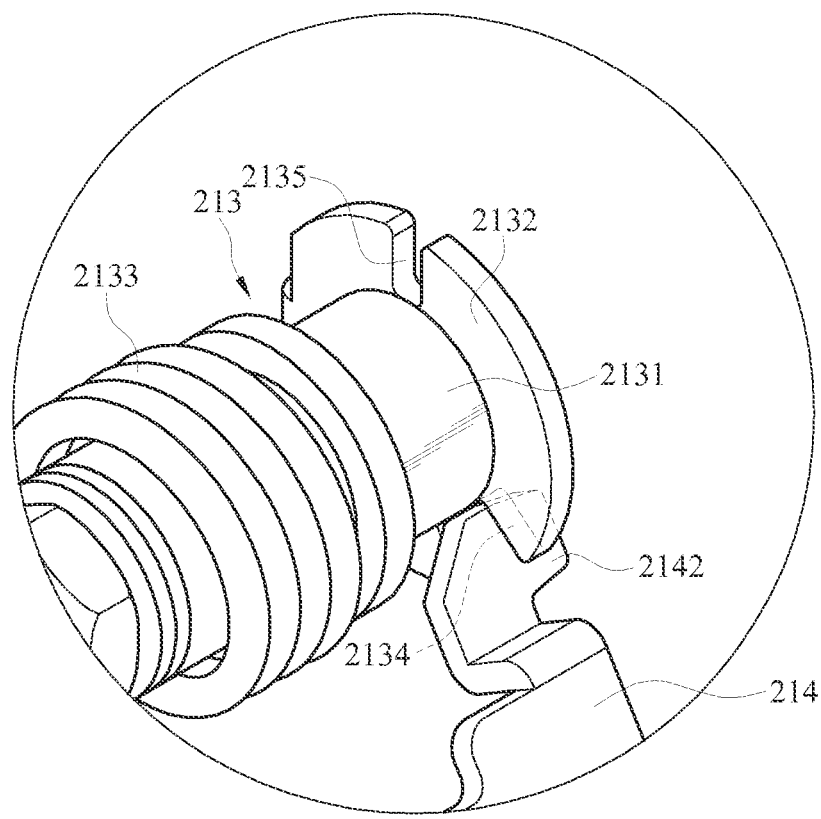
FIG. 8A is a partial enlarged perspective view of FIG. 7A.
Figure 9A:
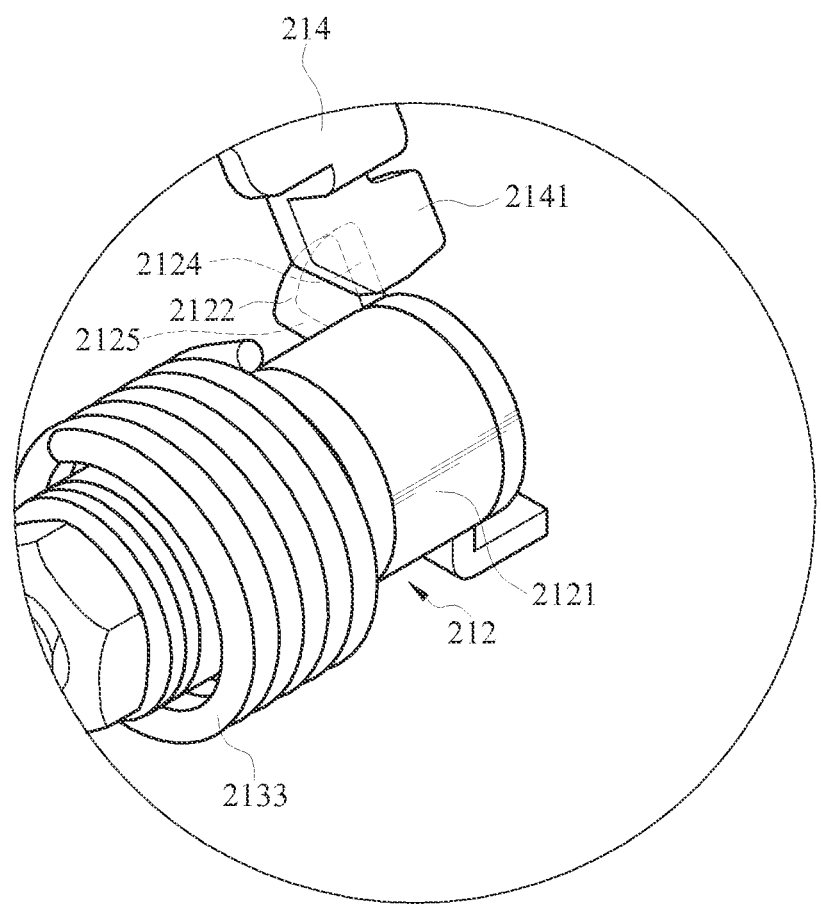
FIG. 9A is a partial enlarged perspective view of FIG. 7A.
Figure 10:
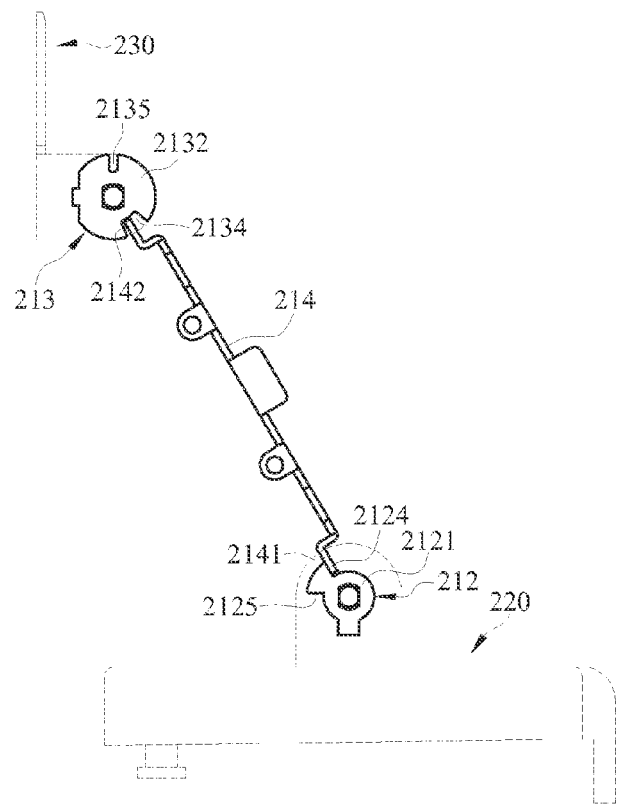
FIG. 10 is a schematic sectional side view of a linkage mechanism in an upright state.

The structure and pivoting method of the linkage mechanism 200 will be described below. Referring to FIG. 7A, FIG. 7E, FIG. 8A, FIG. 9A and FIG. 10, FIG. 7A is a first view illustrating the operation of a linkage mechanism according to an embodiment of the disclosure, FIG. 7E is a schematic three-dimensional exploded view of a linkage mechanism according to an embodiment of the disclosure, FIG. 8A and FIG. 9A are partial enlarged perspective views of FIG. 7A, and FIG. 10 is a schematic sectional side view of a linkage mechanism in an upright state. In this embodiment, the linkage mechanism 200 comprises a connecting structure 210, a bottom base 220 and a top plate 230. The bottom base 220 and the top plate 230 are respectively disposed at two opposite ends of the connecting structure 210. The connecting structure 210 comprises a connecting plate 211, two pivoting members 212, two pivoting members 213 and two stopping members 214.

The pivoting members 212 and 213 are respectively located at two ends of the connecting plate 211, and the connecting plate 211 is connected to the bottom base 220 through the pivoting member 212 and is connected to the top plate 230 through the pivoting member 213. Each of the pivoting members 212 comprises a shaft 2121 and a limiting piece 2122, the shaft 2121 has a second axis A2, and the limiting piece 2122 is disposed on the shaft 2121 and adapted to pivot around the second axis A2 of the shaft 2121. Similarly, each of the pivoting members 213 comprises a shaft 2131 and a limiting piece 2132, the shaft 2131 has a third axis A3, and the limiting piece 2132 is disposed on the shaft 2131 and adapted to pivot around the third axis A3 of the shaft 2131. In this embodiment and some other embodiments, each of the pivoting members 212 and 213 comprises a plurality of torsion springs 2133, and the torsion springs 2133 are used for correspondingly adjusting the pivoting friction of the pivoting members 212 and 213.

The two stopping members 214 are movably disposed on two sides of the connecting plate 211 respectively, and are capable of moving relative to the connecting plate 211. Each of the stopping members 214 has two fastening portions 2141 and 2142, which are respectively disposed on two sides of the stopping member 214. The fastening portions 2141 are respectively fastened to the limiting pieces 2122, and the fastening portions 2142 are respectively fastened to the limiting pieces 2132. Further, in this embodiment and some other embodiments, each of the limiting pieces 2122 has two notches 2124 and 2125, and the fastening portion 2141 of the stopping member 214 is adapted to be blocked (namely, limited) in the notches 2124 and 2125. Each of the limiting pieces 2132 has two notches 2134 and 2135, and the fastening portion 2142 of the stopping member 214 is adapted to be blocked (namely, limited) in the notches 2134 and 2135; however, the number of the notches is not intended to limit the disclosure. In addition, when the fastening portion 2142 is blocked (limited) in the notch 2134 or the notch 2135, the fastening portion 2142 may pivot slightly inside the notch 2134 or the notch 2135 under an external force.

In this embodiment and some other embodiments, the connecting structure 210 further comprises four second elastic members 215, the connecting plate 211 has four accommodation grooves 2111, and the second elastic members 215 are respectively disposed in the corresponding accommodation grooves 2111 and are respectively pressed against the corresponding stopping members 214. When the stopping member 214 is moved toward the connecting plate 211, the second elastic members 215 are pushed by the stopping member 214 and produce a reverse elastic force. In addition, the connecting structure 210 further comprises a cover 216, the cover 216 comprises a first magnetic member 2161, the connecting plate 211 has a second magnetic member 2112 (as shown in FIG. 7E), and the first magnetic member 2161 of the cover 216 is magnetically (and detachably) connected to the second magnetic member 2112 of the connecting plate 211. The linkage mechanism 200 further comprises a first side frame 240 and a second side frame 250, which are respectively located on two opposite sides of the connecting plate 211 and are respectively connected to the pivoting member 212 and the pivoting member 213.

The pivoting method of the linkage mechanism 200 will be described below. Referring to FIG. 1, FIG. 7A, FIG. 8A, FIG. 9A and FIG. 10, at this time, the linkage mechanism 200 is in an upright state. Since the fastening portions 2141 and 2142 of the stopping member 214 are located in the notches 2124 and 2134 respectively, the bottom base 220 and the top plate 230 only can pivot slightly respectively around the second axis A2 and the third axis A3. The degrees of pivoting correspond to angles at which the fastening portions 2141 and 2142 can pivot inside the notches 2124 and 2134 respectively. Therefore, when the linkage mechanism 200 is in the upright state, the user may dispose the electronic device 10 on a desktop (not shown) for use.

Figure 7B:
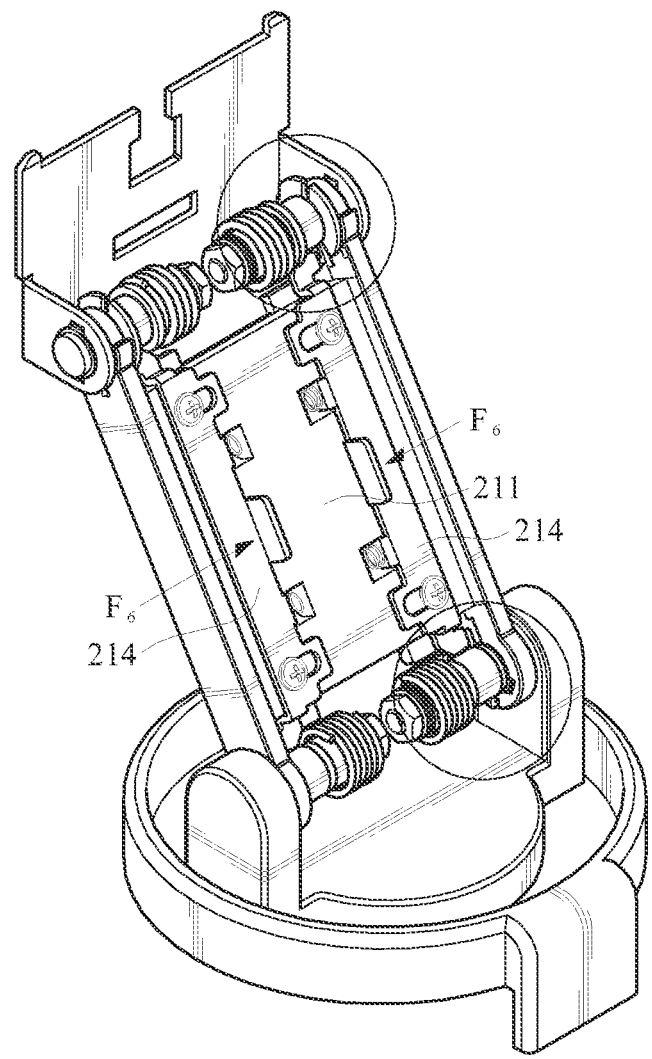
FIG. 7B is a second view illustrating the operation of a linkage mechanism according to an embodiment of the disclosure.
Figure 8B:
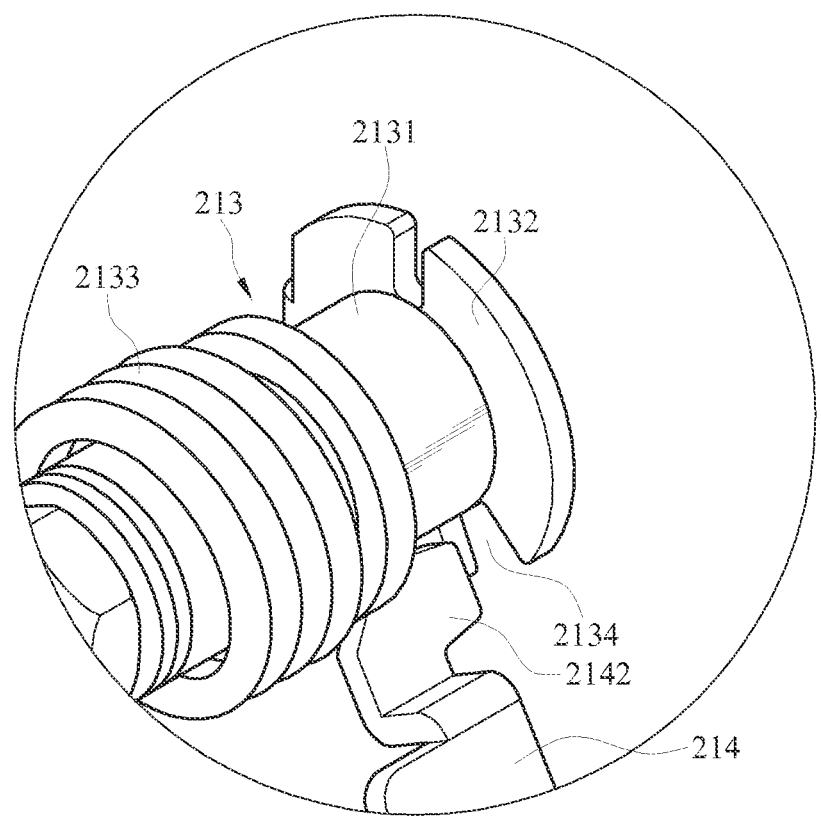
FIG. 8B is a partial enlarged perspective view of FIG. 7B.
Figure 9B:
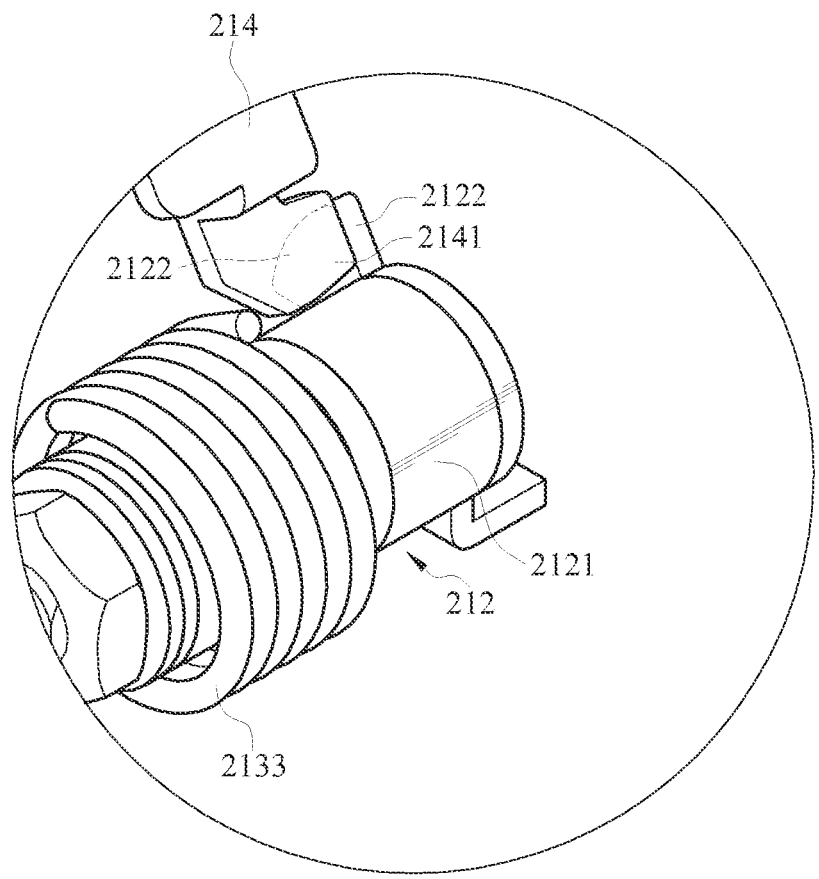
FIG. 9B is a partial enlarged perspective view of FIG. 7B.

Referring to FIG. 7B, FIG. 8B and FIG. 9B, FIG. 7B is a second view illustrating the operation of a linkage mechanism according to an embodiment of the disclosure, and FIG. 8B and FIG. 9B are partial enlarged perspective views of FIG. 7B. Then, in this embodiment, when it is intended to fold the linkage mechanism 200, the two stopping members 214 are respectively driven by a sixth external force F6 to move toward the connecting plate 211. At this time, the fastening portions 2141 and 2142 of the stopping member 214 are respectively detached from the notches 2124 and 2134.

Figure 7C:
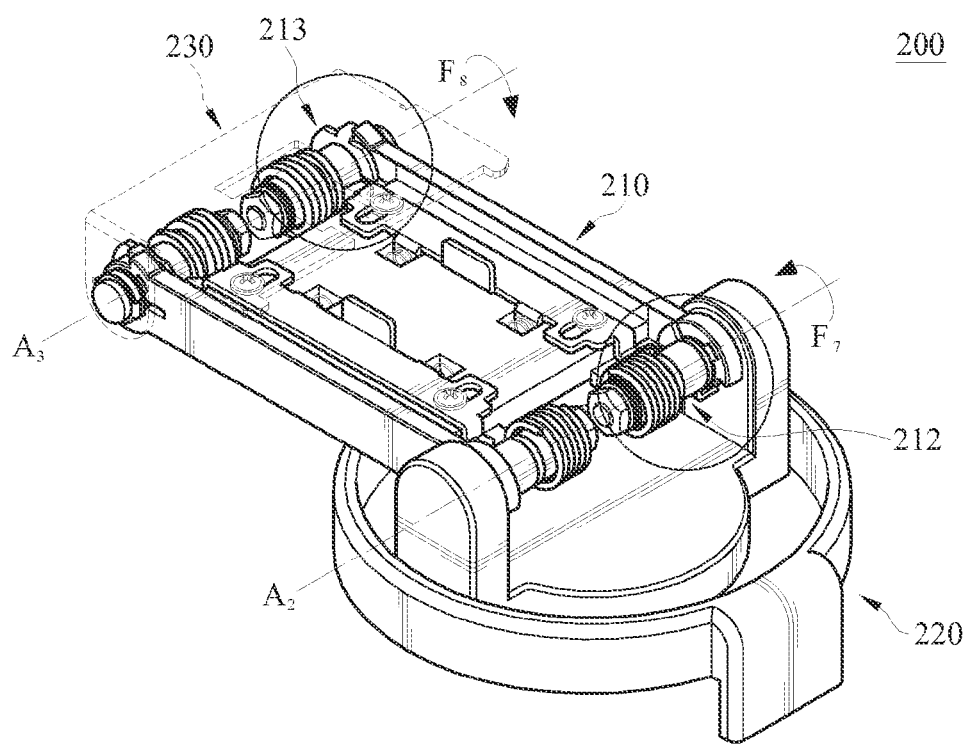
FIG. 7C is a third view illustrating the operation of a linkage mechanism according to an embodiment of the disclosure.
Figure 8C:
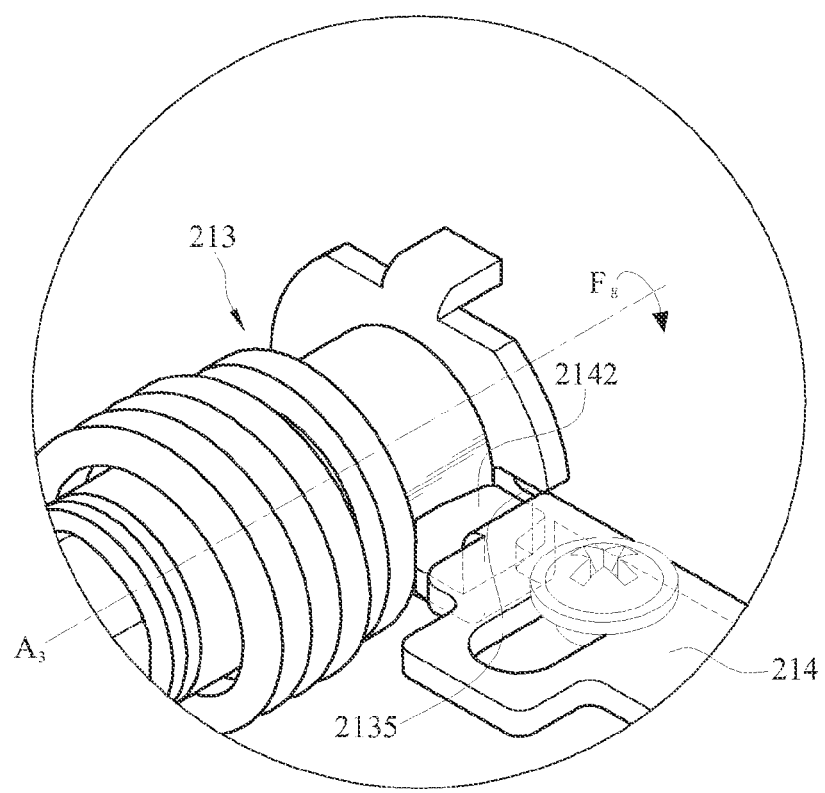
FIG. 8C is a partial enlarged perspective view of FIG. 7C.
Figure 9C:
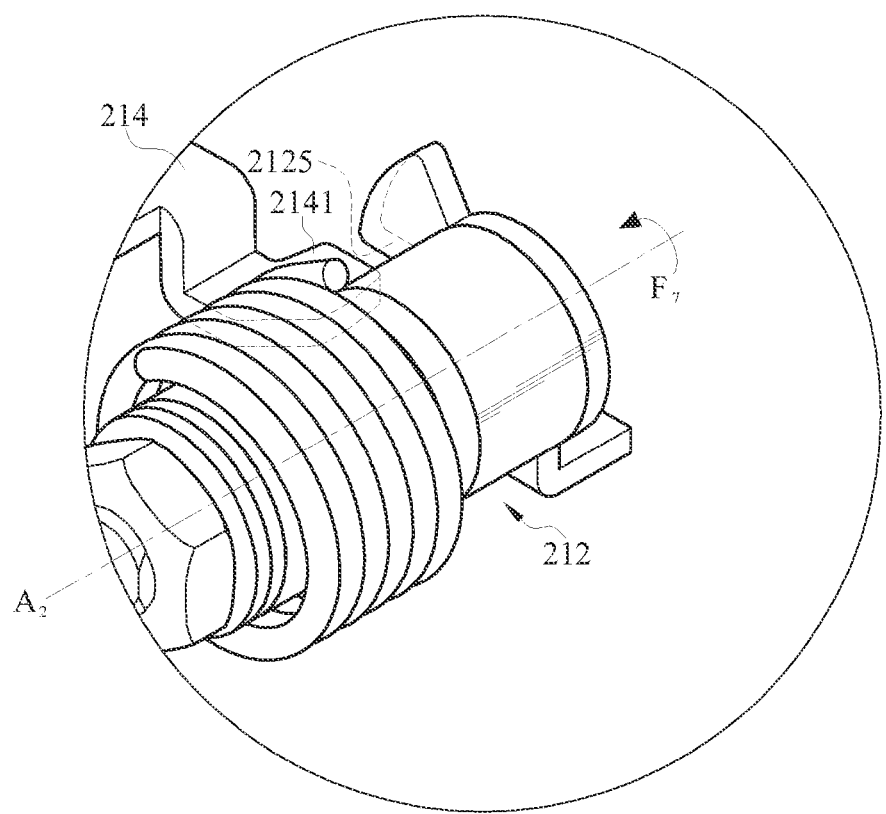
FIG. 9C is a partial enlarged perspective view of FIG. 7C.

Referring to FIG. 7C, FIG. 8C and FIG. 9C, FIG. 7C is a third view illustrating the operation of a linkage mechanism according to an embodiment of the disclosure, and FIG. 8C and FIG. 9C are partial enlarged perspective views of FIG. 7C. Afterward, in this embodiment, a seventh external force F7 is applied to drive the connecting structure 210 to pivot about the second axis A2 of the pivoting member 212 relative to the bottom base 220. At the same time, an eighth external force F8 is applied to drive the top plate 230 to pivot around the third axis A3 of the pivoting member 213 relative to the connecting structure 210. The fastening portion 2141 pivots toward the notch 2125, and the fastening portion 2142 pivots toward the notch 2135.

Figure 7D:
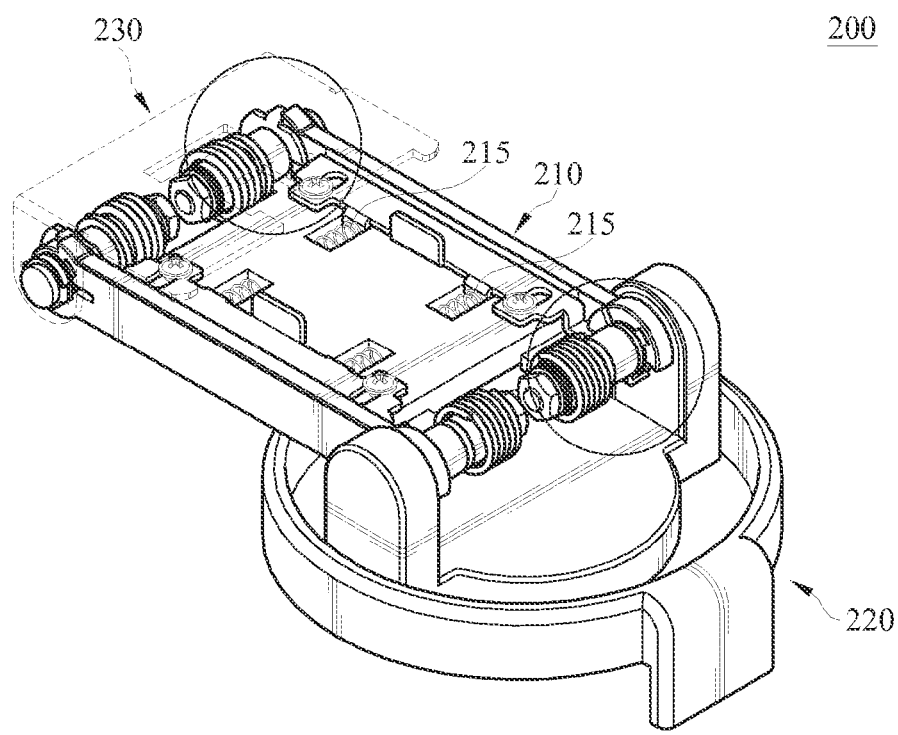
FIG. 7D is a fourth view illustrating the operation of a linkage mechanism according to an embodiment of the disclosure.
Figure 8D:
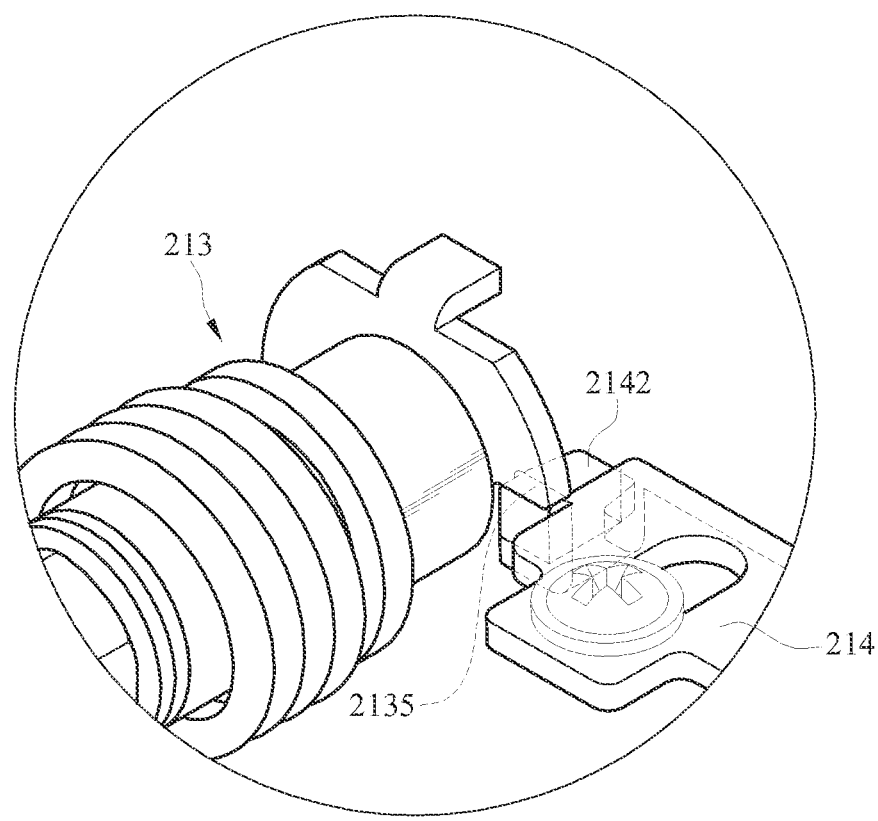
FIG. 8D is a partial enlarged perspective view of FIG. 7D.
Figure 9D:
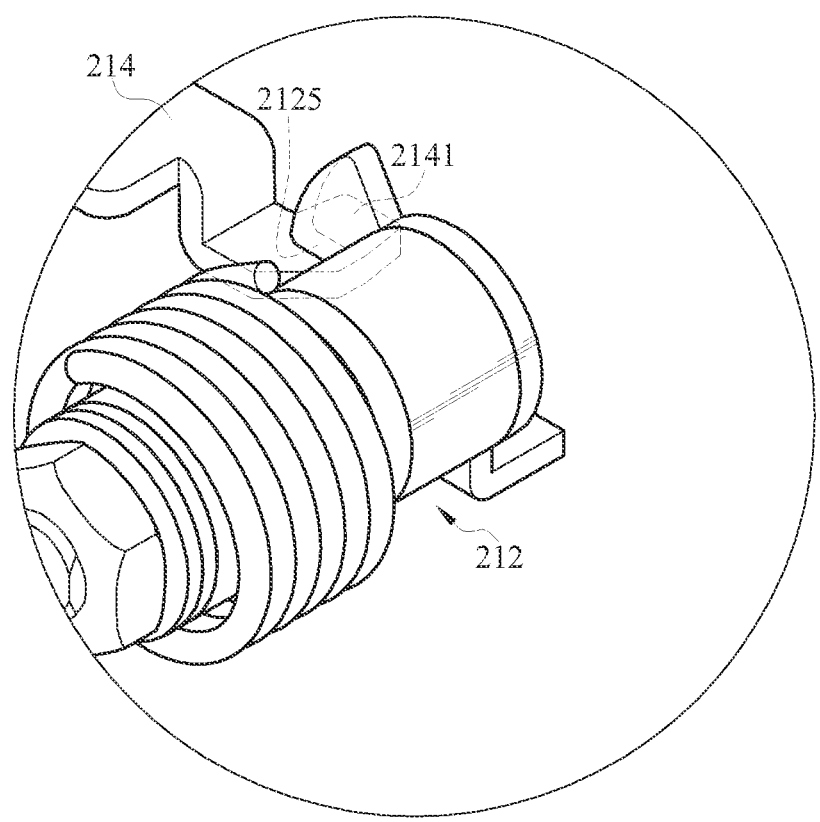
FIG. 9D is a partial enlarged perspective view of FIG. 7D.
Figure 11:
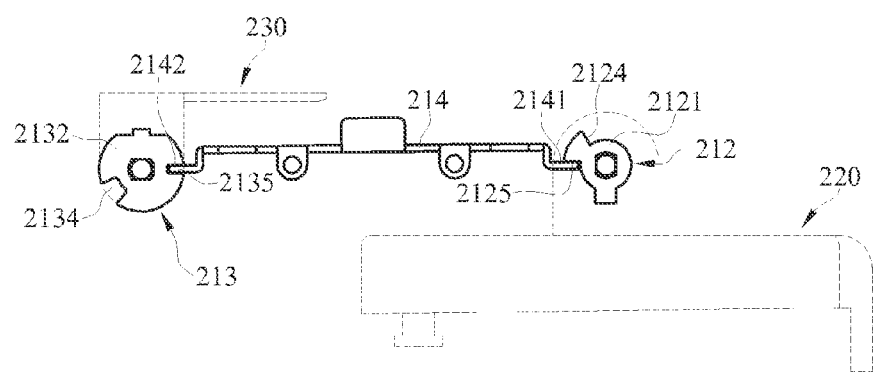
FIG. 11 is a schematic sectional side view of a linkage mechanism in a folded state.

Referring to FIG. 3, FIG. 7D, FIG. 8D, FIG. 9D and FIG. 11, FIG. 7D is a fourth view illustrating the operation of a linkage mechanism according to an embodiment of the disclosure, FIG. 8D and FIG. 9D are partial enlarged perspective views of FIG. 7D, and FIG. 11 is a schematic sectional side view of a linkage mechanism in a folded state. Finally, in this embodiment, under an elastic restoring force of the second elastic members 215, the fastening portion 2141 of the stopping member 214 is fastened to the notch 2125, and the fastening portion 2142 of the stopping member 214 is fastened to the notch 2135. Thus, the pivoting of the platform 400, the linkage mechanism 200 and the display module 300 results the linkage mechanism 200 in a folded state. Such a configuration reduces the space occupied when the electronic device 10 is folded, thereby facilitating the user to operate and carry the electronic device 10.

Based on the electronic device and the linkage mechanism thereof disclosed in the above embodiments of the disclosure, the fastening structure of the platform and the fixing column of the linkage mechanism can be fastened to and detached from each other, and the fastening member of the display module and the top plate of the linkage mechanism can be fastened to and detached from each other. Therefore, compared to the prior art, the electronic device and the linkage mechanism thereof, disclosed in the embodiments of the disclosure, address the difficulty in assembly and disassembly of the electronic device in the prior art. Moreover, the two pivoting members and the rotatable component of the linkage mechanism of the disclosure can all pivot relative to the display module or the platform, so that the linkage mechanism may be in the upright state or the folded state. Therefore, the electronic device and the linkage mechanism thereof, disclosed in the disclosure, also address the problem that the display module can only pivot in one direction, thereby providing convenience in use and carrying and reducing the occupied space.

What is claimed is:

1. A linkage mechanism, comprising:
    a connecting structure, comprising:
        a connecting plate;
        two pivoting members, respectively located at two opposite ends of the connecting plate, each of the pivoting members comprising a shaft and a limiting piece, the limiting pieces being respectively disposed on the shafts and adapted to rotate relative to the shafts; and
        a stopping member, movably disposed on the connecting plate, and having two fastening portions, the fastening portions being respectively disposed on two sides of the stopping member and respectively fastened to the limiting pieces;
    a bottom base, one of the pivoting members being pivotally disposed on the bottom base; and
    a top plate, the other pivoting member being pivotally disposed on the top plate;
    wherein when the stopping member is moved and detached from the limiting pieces, the connecting structure is adapted to pivot relative to the bottom base and the top plate respectively.

2. The linkage mechanism according to claim 1, wherein the bottom base further comprises a rotatable component and a fixing component, one end of the rotatable component being pivotally disposed on the fixing component, one of the pivoting members being pivotally connected to the rotatable component, and an axis which the rotatable component pivots relative to the fixing component is different from axes which the connecting structure pivots relative to the rotatable component and relative to the top plate.

3. The linkage mechanism according to claim 2, wherein the axis, which the rotatable component pivots relative to the fixing component, runs through the fixing component.

4. The linkage mechanism according to claim 2, wherein the axis, which the rotatable component pivots relative to the fixing component is orthogonal to the axes, which the connecting structure pivots relative to the bottom base and relative to the top plate.

5. The linkage mechanism according to claim 1, wherein the axes, which the connecting structure pivots relative to the bottom base and relative to the top plate, are parallel to each other.

6. The linkage mechanism according to claim 1, wherein each of the limiting pieces has a notch, and the fastening portions of the stopping member is respectively blocked in the notches.

7. The linkage mechanism according to claim 1, wherein the connecting structure further comprises a second elastic member, the connecting plate has an accommodation groove, and the second elastic member is disposed in the accommodation groove and pressed against the stopping member.

8. The linkage mechanism according to claim 1, wherein the connecting structure further comprises a cover, the cover comprises a first magnetic member, and the connecting plate comprises a second magnetic member, the first magnetic member of the cover is magnetically connected to the second magnetic member of the connecting plate.

9. An electronic device, comprising:
    a platform, comprising a substrate and a fastening structure, wherein the substrate has a first surface, a second surface and a fastening slot, the fastening slot being formed through the first surface and the second surface that are opposite to each other, and the fastening structure being pivotally disposed on the second surface and comprising a hook, the hook being located on the fastening slot;
    a linkage mechanism, comprising a top plate and a bottom base, wherein the top plate has a through slot, the bottom base comprises a fixing column, and the hook is detachably fastened to the fixing column; and
    a display module, comprising a main body, a fastening member and a fixing plate, wherein the fastening member is disposed on the main body, the fixing plate has at least one assembly hole formed through the fixing plate, and the fastening member has at least one fastening plate running through the assembly hole of the fixing plate and the through slot, and the fastening plate being detachably fastened to the top plate.

10. The electronic device according to claim 9, wherein the fastening slot has an inserting segment and a fastening segment, the platform comprises a first elastic member, an inner diameter of the inserting segment is greater than an outer diameter of the fixing column, an inner diameter of the fastening segment is roughly equal to or smaller than the outer diameter of the fixing column, the first elastic member is disposed in the platform and faces the fastening slot of the second surface, and when the fixing column is inserted into the inserting segment and moved to the fastening segment, the first elastic member pushes against the fastening structure, so that the hook fastens and fixes to the fixing column.

11. The electronic device according to claim 9, wherein the platform comprises a first elastic member, disposed inside the platform, facing the fastening slot of the second surface, and pressed against the fastening structure.

12. The electronic device according to claim 9, wherein the fixing plate has a disassembly hole formed through the fixing plate, the fastening member has a first pressing portion running through the disassembly hole, and when the first pressing portion is moved toward the main body, the fastening plate is detached from the assembly hole, so that the top plate is detached from the fastening member.

13. The electronic device according to claim 9, wherein the substrate has a through hole formed through the first surface and the second surface, the fastening structure comprises a second pressing portion running through the through hole from the second surface toward the first surface, and when the second pressing portion pivots from the first surface toward the second surface, the hook is detached from the fixing column, so that the bottom base is detached from the platform.

14. The electronic device according to claim 9, wherein the bottom base comprises a stopping portion pressed against the platform, and the fixing column is located between the stopping portion and the fastening structure.

15. An electronic device, comprising:
a linkage mechanism, comprising:
   a connecting structure, comprising:
      a connecting plate;
      two pivoting members, respectively located at two ends of the connecting plate, each of the pivoting members comprising a shaft and a limiting piece, the limiting pieces being respectively disposed on the shafts and adapted to rotate relative to the shafts; and
      a stopping member, movably disposed on the connecting plate, and having two fastening portions, the fastening portions being respectively disposed on two opposite sides of the stopping member and respectively fastened to the limiting pieces;
a bottom base, comprising a fixing column, and one of the pivoting members being pivotally disposed on the bottom base; and
a top plate, the other pivoting member being pivotally disposed on the top plate, the top plate having a through slot, and when the stopping member is moved and detached from the limiting pieces, the connecting structure pivots relative to the bottom base and the top plate respectively;
a platform, the bottom base being detachably disposed on the platform, the platform comprising a substrate and a fastening structure, wherein the substrate has a first surface, a second surface and a fastening slot, the fastening slot being formed through the first surface and the second surface that are opposite to each other, and the fastening structure is pivotally disposed on the second surface and comprises a hook, the hook being detachably fastened to the fixing column; and
a display module, comprising a main body, a fastening member and a fixing plate, wherein the fastening member is disposed on the main body, the fixing plate has at least one assembly hole formed through the fixing plate, the fastening member has at least one fastening plate running through the assembly hole of the fixing plate and the through slot, and the fastening plate being detachably fastened to the top plate.

16. The electronic device according to claim 15, wherein the bottom base comprises a rotatable component and a fixing component, one end of the rotatable component being pivotally disposed on the fixing component, one of the pivoting members being pivotally connected to the rotatable component, and an axis which the rotatable component pivots relative to the fixing component is different from axes which the connecting structure pivots relative to the rotatable component and relative to the top plate.

17. The electronic device according to claim 16, wherein the axis, which the rotatable component pivots relative to the fixing component, runs through the fixing component.

18. The electronic device according to claim 16, wherein the axis, which the rotatable component pivots relative to the fixing component, is orthogonal to the axes, which the connecting structure pivots relative to the bottom base and the top plate.

19. The electronic device according to claim 15, wherein the axes, which the connecting structure pivots relative to the bottom base and the top plate, are parallel to each other.

20. The electronic device according to claim 15, wherein each of the limiting pieces has a notch, the fastening portions of the stopping member being blocked respectively and positioned in the notches.

21. The electronic device according to claim 15, wherein the connecting structure further comprises a second elastic member, the connecting plate has an accommodation groove, and the second elastic member is disposed in the accommodation groove and pressed against the stopping member.

22. The electronic device according to claim 15, wherein the connecting structure further comprises a cover, the cover comprising a first magnetic member, and wherein the connecting plate has a second magnetic member, the first magnetic member of the cover is magnetically connected to the second magnetic member of the connecting plate.

23. The electronic device according to claim 15, wherein the fastening slot has an inserting segment and a fastening segment, the platform comprises a first elastic member, an inner diameter of the inserting segment is greater than an outer diameter of the fixing column, an inner diameter of the fastening segment is roughly equal to, or smaller than, the outer diameter of the fixing column, the first elastic member is disposed inside the platform and faces the fastening slot of the second surface, and when the fixing column is inserted into the inserting segment and moved to the fastening segment, the first elastic member pushes against the fastening structure, so that the hook fastens and fixes to the fixing column.

24. The electronic device according to claim 15, wherein the platform comprises a first elastic member, disposed inside the platform, facing the fastening slot of the second surface, and pressed against the fastening structure.

25. The electronic device according to claim 15, wherein the fixing plate has a disassembly hole formed through the fixing plate, the fastening member has a first pressing portion running through the disassembly hole, and when the first pressing portion is moved toward the main body, the fastening plate is detached from the assembly hole, so that the top plate is detached from the fastening member.

26. The electronic device according to claim 15, wherein the substrate has a through hole formed through the first surface and the second surface, the fastening structure comprises a second pressing portion running through the through hole from the second surface toward the first surface, and when the second pressing portion pivots from the first surface toward the second surface, the hook is detached from the fixing column, so that the bottom base is detached from the platform.

27. The electronic device according to claim 15, wherein the bottom base comprises a stopping portion pressed against the platform, and the fixing column is located between the stopping portion and the fastening structure.

* * * * *